United States Patent
Chen et al.

(10) Patent No.: US 9,852,998 B2
(45) Date of Patent: Dec. 26, 2017

(54) RING STRUCTURES IN DEVICE DIE

(71) Applicant: Taiwan Semiconductor Manufacturing Company, Ltd., Hsin-Chu (TW)

(72) Inventors: Ying-Ju Chen, Tuku Township (TW); Jie Chen, New Taipei (TW); Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/467,698

(22) Filed: Aug. 25, 2014

(65) Prior Publication Data

US 2015/0348916 A1    Dec. 3, 2015

Related U.S. Application Data

(60) Provisional application No. 62/005,735, filed on May 30, 2014.

(51) Int. Cl.
*H01L 23/62* (2006.01)
*H01L 23/00* (2006.01)
(Continued)

(52) U.S. Cl.
CPC ........ *H01L 23/562* (2013.01); *H01L 21/4803* (2013.01); *H01L 21/486* (2013.01); *H01L 21/4825* (2013.01); *H01L 21/565* (2013.01); *H01L 21/6835* (2013.01); *H01L 23/3114* (2013.01); *H01L 23/3142* (2013.01); *H01L 23/3157* (2013.01); *H01L 23/49503* (2013.01); *H01L 23/49527* (2013.01); *H01L 23/49541* (2013.01); *H01L 23/525* (2013.01); *H01L 23/5385* (2013.01); *H01L 23/5389* (2013.01); *H01L 23/585* (2013.01); *H01L 24/19* (2013.01); *H01L 25/105* (2013.01); *H01L 21/568* (2013.01); *H01L 23/3128* (2013.01); *H01L 23/49816* (2013.01); *H01L 24/32* (2013.01); *H01L 24/48* (2013.01); *H01L 24/73* (2013.01);
(Continued)

(58) Field of Classification Search
CPC .................................................. H01L 21/4803
See application file for complete search history.

(56) References Cited

U.S. PATENT DOCUMENTS 6,770,971 B2 *  8/2004  Kouno ................ H01L 23/3114
                                                        252/514
7,064,440 B2 *  6/2006  Jobetto ............... H01L 21/4857
                                                        257/210
(Continued)

FOREIGN PATENT DOCUMENTS

CN          1519924 A     8/2004
CN        102272903 A    12/2011
(Continued)

*Primary Examiner* — Caridad Everhart
*Assistant Examiner* — Ankush Singal
(74) *Attorney, Agent, or Firm* — Slater Matsil, LLP

(57) ABSTRACT

A die includes a metal pad, a passivation layer over the metal pad, and a polymer layer over the passivation layer. A metal pillar is over and electrically coupled to the metal pad. A metal ring is coplanar with the metal pillar. The polymer layer includes a portion coplanar with the metal pillar and the metal ring.

20 Claims, 17 Drawing Sheets

(51) Int. Cl.

| | |
|---|---|
| *H01L 21/48* | (2006.01) |
| *H01L 21/56* | (2006.01) |
| *H01L 23/31* | (2006.01) |
| *H01L 23/495* | (2006.01) |
| *H01L 23/58* | (2006.01) |
| *H01L 25/10* | (2006.01) |
| *H01L 23/525* | (2006.01) |
| *H01L 23/538* | (2006.01) |
| *H01L 21/683* | (2006.01) |
| *H01L 23/498* | (2006.01) |

(52) U.S. Cl.
CPC .............. *H01L 24/83* (2013.01); *H01L 24/92* (2013.01); *H01L 24/94* (2013.01); *H01L 2221/68372* (2013.01); *H01L 2221/68381* (2013.01); *H01L 2224/04105* (2013.01); *H01L 2224/12105* (2013.01); *H01L 2224/32225* (2013.01); *H01L 2224/48091* (2013.01); *H01L 2224/48227* (2013.01); *H01L 2224/73265* (2013.01); *H01L 2224/73267* (2013.01); *H01L 2224/83005* (2013.01); *H01L 2224/83191* (2013.01); *H01L 2224/92244* (2013.01); *H01L 2224/94* (2013.01); *H01L 2225/1035* (2013.01); *H01L 2225/1041* (2013.01); *H01L 2225/1058* (2013.01); *H01L 2924/00014* (2013.01); *H01L 2924/1436* (2013.01); *H01L 2924/1437* (2013.01); *H01L 2924/15311* (2013.01); *H01L 2924/181* (2013.01)

(56) References Cited

U.S. PATENT DOCUMENTS

| | | | | |
|---|---|---|---|---|
| 7,429,793 B2* | 9/2008 | Yamagata | ........... | H01L 23/5389 257/678 |
| 7,550,833 B2* | 6/2009 | Mihara | ............... | H01L 23/5389 257/686 |
| 7,619,901 B2* | 11/2009 | Eichelberger | ....... | H01L 21/6835 361/763 |
| 7,821,107 B2 | 10/2010 | Pratt | | |
| 8,168,529 B2 | 5/2012 | Lin et al. | | |
| 8,193,555 B2 | 6/2012 | Lin et al. | | |
| 8,293,574 B2* | 10/2012 | Mihara | ............... | H01L 23/5389 438/107 |
| 8,343,810 B2* | 1/2013 | Oh | ........................ | H05K 1/186 257/E23.136 |
| 8,587,124 B2* | 11/2013 | Mizusawa | ........... | H01L 23/3114 257/177 |
| 2004/0150070 A1 | 8/2004 | Okada et al. | | |
| 2004/0262763 A1* | 12/2004 | Windlass | .............. | H01L 23/564 257/758 |
| 2005/0098893 A1 | 5/2005 | Tsutsue et al. | | |
| 2006/0087044 A1 | 4/2006 | Goller | | |
| 2007/0205520 A1* | 9/2007 | Chou | .................. | H01L 23/3157 257/780 |
| 2008/0185685 A1 | 8/2008 | Nakashiba | | |
| 2010/0123219 A1 | 5/2010 | Chen et al. | | |
| 2010/0233831 A1 | 9/2010 | Pohl et al. | | |
| 2011/0114355 A1* | 5/2011 | Bauer | ................... | H01L 23/053 174/50.5 |
| 2011/0227223 A1* | 9/2011 | Wu | ........................ | H01L 24/82 257/738 |
| 2011/0278722 A1 | 11/2011 | Miki | | |
| 2011/0284843 A1* | 11/2011 | Chen | ....................... | H01L 22/34 257/48 |
| 2013/0001776 A1 | 1/2013 | Yu et al. | | |
| 2013/0181338 A1* | 7/2013 | Lu | ....................... | H01L 23/3157 257/737 |
| 2013/0241049 A1* | 9/2013 | Yu | ........................ | H01L 23/585 257/737 |
| 2014/0084444 A1 | 3/2014 | Lin | | |
| 2014/0183690 A1* | 7/2014 | Lii | ..................... | H01L 23/3192 257/531 |
| 2014/0183693 A1* | 7/2014 | Tsai | ........................ | H01L 23/48 257/532 |
| 2014/0183744 A1* | 7/2014 | Lee | ...................... | H01L 21/563 257/762 |
| 2014/0264824 A1* | 9/2014 | Lu | .......................... | H01L 24/81 257/734 |
| 2014/0346671 A1* | 11/2014 | Yu | ........................ | H01L 23/481 257/737 |
| 2015/0069623 A1* | 3/2015 | Tsai | ..................... | H01L 21/563 257/774 |
| 2015/0170995 A1* | 6/2015 | Chen | ....................... | H01L 24/11 257/774 |

FOREIGN PATENT DOCUMENTS

| | | |
|---|---|---|
| DE | 10320646 | 9/2004 |
| KR | 1020130052179 A | 5/2013 |
| TW | 201001647 A | 1/2010 |
| TW | 201103136 A | 1/2011 |

* cited by examiner

RING STRUCTURES IN DEVICE DIE

PRIORITY CLAIM AND CROSS-REFERENCE

This application claims the benefit of the following provisionally filed U.S. patent application Ser. No. 62/005,735, filed May 30, 2014, and entitled "Protective Pillars and Method of Forming Same;" which application is hereby incorporated herein by reference.

BACKGROUND

The fabrication of modern circuits typically involves several steps. Integrated circuits are first fabricated on a semiconductor wafer, which contains multiple duplicated semiconductor chips, each comprising integrated circuits. The semiconductor chips are then sawed from the wafer and packaged. The packaging processes have two main purposes: to protect delicate semiconductor chips and connect interior integrated circuits to exterior pins.

With the increasing demand for more functions, Package-on-Package (PoP) technology, in which two or more packages are bonded in order to expand the integration ability of the packages, was developed. With a high degree of integration, the electrical performance of the resulting PoP package can be improved benefiting from the shortened connecting paths between components. By using PoP technology, package design becomes more flexible and less complex. Time-to-market is also reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
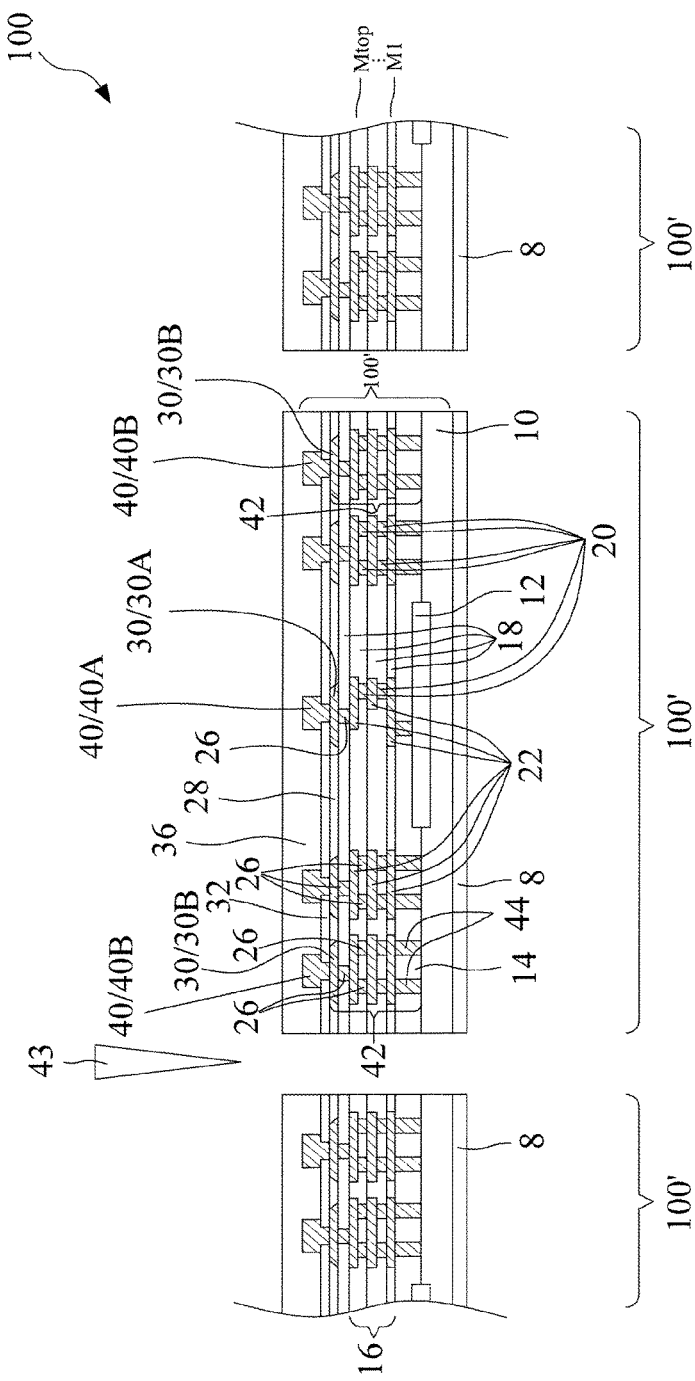
FIG. 1 illustrates a cross-sectional view of a wafer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A device die and the method of forming a package including the device die are provided in accordance with various exemplary embodiments. The intermediate stages of forming the package are illustrated. The variations of the embodiments are discussed. Throughout the various views and illustrative embodiments, like reference numbers are used to designate like elements.

FIGS. 1 through 16 illustrate the cross-sectional views of intermediate stages in the formation of a package in accordance with some embodiments. Referring to FIG. 1, wafer 100, which includes a plurality of device dies 100', is provided. Wafer 100 further includes semiconductor substrate 10, which may be a bulk silicon substrate or a silicon-on-insulator substrate. Alternatively, other semiconductor materials that include group III, group IV, and group V elements may also be used, which may include silicon germanium, silicon carbon, and/or III-V compound semiconductor materials. Integrated circuit devices such as transistors (schematically illustrated as 12) are formed in and/or on semiconductor substrate 10. Wafer 100 may further include Inter-Layer Dielectric (ILD) 14 and interconnect structure 16 over semiconductor substrate 10. Interconnect structure 16 includes metal lines 20 and vias 22, which are formed in dielectric layers 18. The metal lines at a same level are collectively referred to as a metal layer hereinafter. Accordingly, interconnect structure 16 may include a plurality of metal layers that are interconnected through vias 22. Metal lines 20 and vias 22 may be formed of copper or copper alloys, although they can also be formed of other metals. In some embodiments, dielectric layers 18 comprise low-k dielectric materials. The dielectric constants (k values) of the low-k dielectric materials may be less than about 3.0 or about 2.5, for example.

The metal layers include a bottom metal layer (also referred to as metal layer one, or M1) through a top metal layer (Mtop). In some embodiments, the Mtop layer is the topmost metal layer that is formed in low-k dielectric materials.

In accordance with some embodiments of the present disclosure, passivation layer 28 is formed over top metal layer Mtop and the respective dielectric layer 18. Passivation layer 28 has a k value greater than 3.8 and is formed using a non-low-k dielectric material. In some embodiments, passivation layer 28 is a composite layer comprising a silicon oxide layer (not shown) and a silicon nitride layer (not shown) over the silicon oxide layer. Passivation layer 28 may also be formed of other non-porous dielectric materials such as Un-doped Silicate Glass (USG), silicon oxynitride, and/or the like.

Metal pads 30 (including 30A and 30B) are formed with portions in passivation layer 28 and may be electrically coupled to integrated circuit devices 12 through vias 26, metal lines 20, and vias 22. Metal pads 30 may be aluminum pads or aluminum-copper pads and hence are alternatively referred to as aluminum pads 30 hereinafter, although other metallic materials may be used. For example, metal pads 30 may have an aluminum (atomic) percentage between about 99.5 percent and about 99.9 percent as well as a copper percentage between about 0.1 percent and about 0.5 percent. In FIG. 1, vias 26 are illustrated as connecting the metal lines 20 in Mtop layer to the overlying metal pads 30. In alternative embodiments, metal pads 30 may be in physical contact with the metal lines (or pads) 20 in top metal layer Mtop with no vias therebetween.

As also shown in FIG. 1, passivation layer 32 is formed over passivation layer 28. The material of passivation layer 32 may be selected from the same candidate materials as those of passivation layer 28. Passivation layers 28 and 32 may be formed of the same dielectric material or may be formed of different dielectric materials. In some embodiments, passivation layer 32 includes a silicon oxide layer and a silicon nitride layer over the silicon oxide layer. Passivation layer 32 is then patterned so that portions of passivation layer 32 cover the edge portions of aluminum pads 30 and central portions of aluminum pads 30 are exposed through the openings in passivation layer 32. Passivation layer 32 may also include a portion level with metal pads 30 in some embodiments.

Metal pillars 40 are formed over metal pads 30. The formation of metal pillars 40 may include performing a Physical Vapor Deposition (PVD) to deposit a seed layer, forming and patterning a mask layer (not shown), with at least some metal pads 30 not masked by the mask layer, and then performing a plating step to form metal pillars 40. The mask layer and the portions of the seed layer covered by the mask layer are then etched. Metal pillars 40 may comprise copper or other metals or metal alloys including copper, aluminum, tungsten, nickel, cobalt, and/or the like.

Dielectric layer 36 is formed as a top feature of wafer 100. Dielectric layer 36 may be a polymer layer and is referred to as polymer layer 36 hereinafter, although it may also be formed of non-polymer and possibly inorganic materials. The formation process may include spin coating, followed by a curing process. As a result of the curing process, polymer layer 36 is solidified. In some embodiments, polymer layer 36 is formed of polybenzoxazole (PBO). In alternative embodiments, polymer layer 36 is formed of other polymers such as benzocyclobutene (BCB), polyimide, or the like. The material of polymer layer 36 may be photo sensitive, although non-photo-sensitive materials may also be used.

Figure 17:
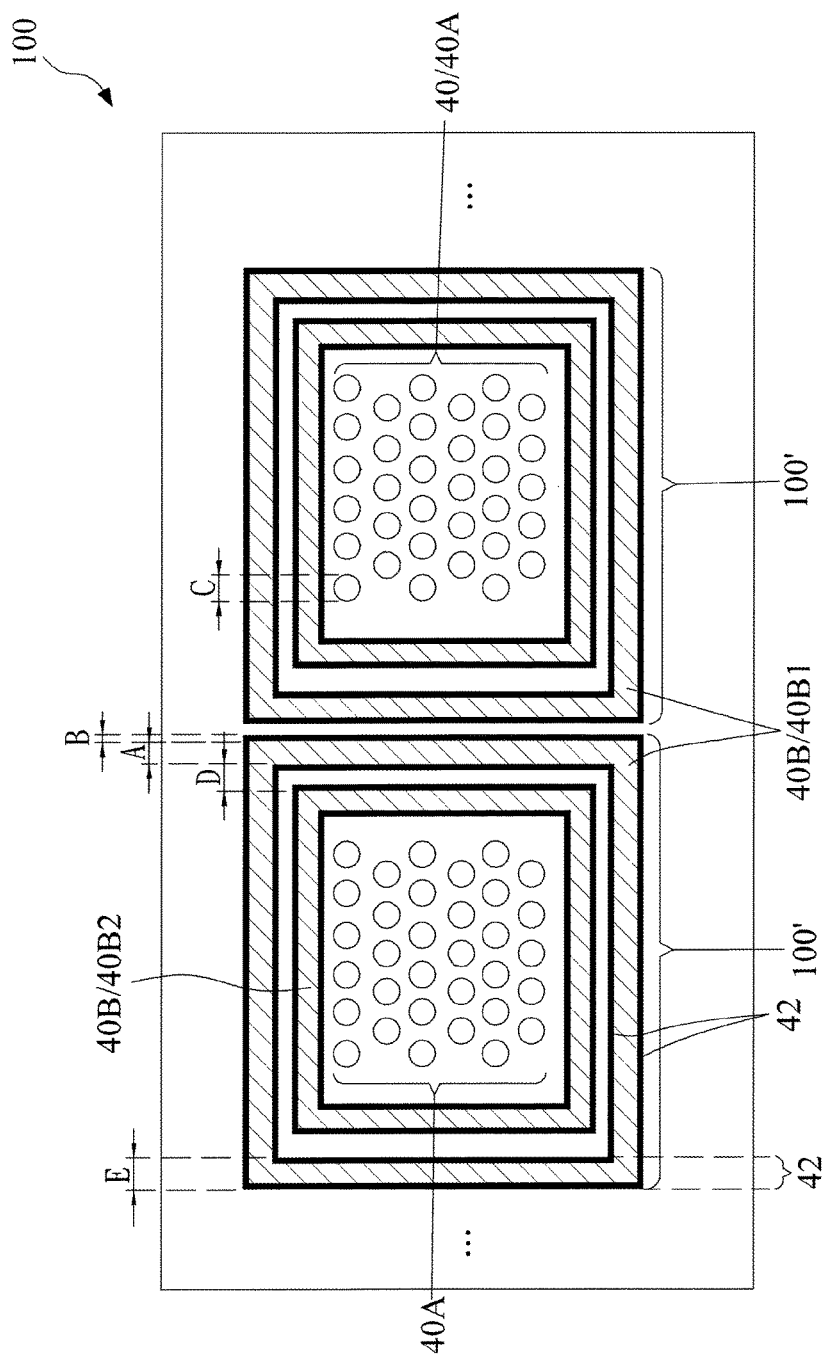
FIG. 17 illustrates a top view of a portion of a wafer in accordance with some embodiments.

Metal pillars 40 include 40A and 40B. Metal pillars 40A are used for the electrical connection between the features in device dies 100' and the features that are to be bonded to device dies 100'. Metal pillars 40B are metal rings that are formed close to the edges of the respective device dies 100'. FIG. 17 illustrates a top view of the structure in FIG. 1, wherein metal pillars 40B are illustrated as having four sides, each adjacent to the respective edges of the corresponding die 100'. Metal pillars 40A are encircled by the respective metal ring 40B. In some embodiments, as shown in FIG. 1, polymer layer 36 extends to the top of metal pillars 40.

Referring back to FIG. 1, in accordance with some embodiments, metal rings 40B overlap the respective seal ring 42. Seal ring 42 includes a plurality of metal rings in dielectric layers 18, wherein the metal rings include a plurality of metal lines 20 forming rings and a plurality of vias 22 forming rings. The rings of metal lines 20 and the rings of vias 22 are connected to form an integrated ring that extends through all dielectric layers 18. In some embodiments, seal ring 42 also includes a ring formed of contact plug 44, which extends to the top surface of semiconductor substrate 10. In addition, metal pad 30B may also form a ring, with the metal ring formed of metal pad 30B connected to the rings in dielectric layers 18 to form an integrated and continuous metal ring, which continuously extends from polymer layer 36 to ILD 14, or possibly to semiconductor substrate 10.

Seal ring 42 may also include four sides, each adjacent to an edge of the respective die 100', as shown in FIG. 17. Furthermore, the four sides of metal ring 40B may overlap the respective sides of seal ring 42.

As also shown in FIG. 1, a die saw step (represented by saw blade 43) is performed to saw wafer 100 into a plurality of device dies 100', each including metal pillars 40A, metal ring 40B, and seal ring 42. Die-Attach Films (DAFs) 8 are attached to the bottom surface of wafer 100 and hence may also be attached to the bottom of each die 100'.

Figure 2:
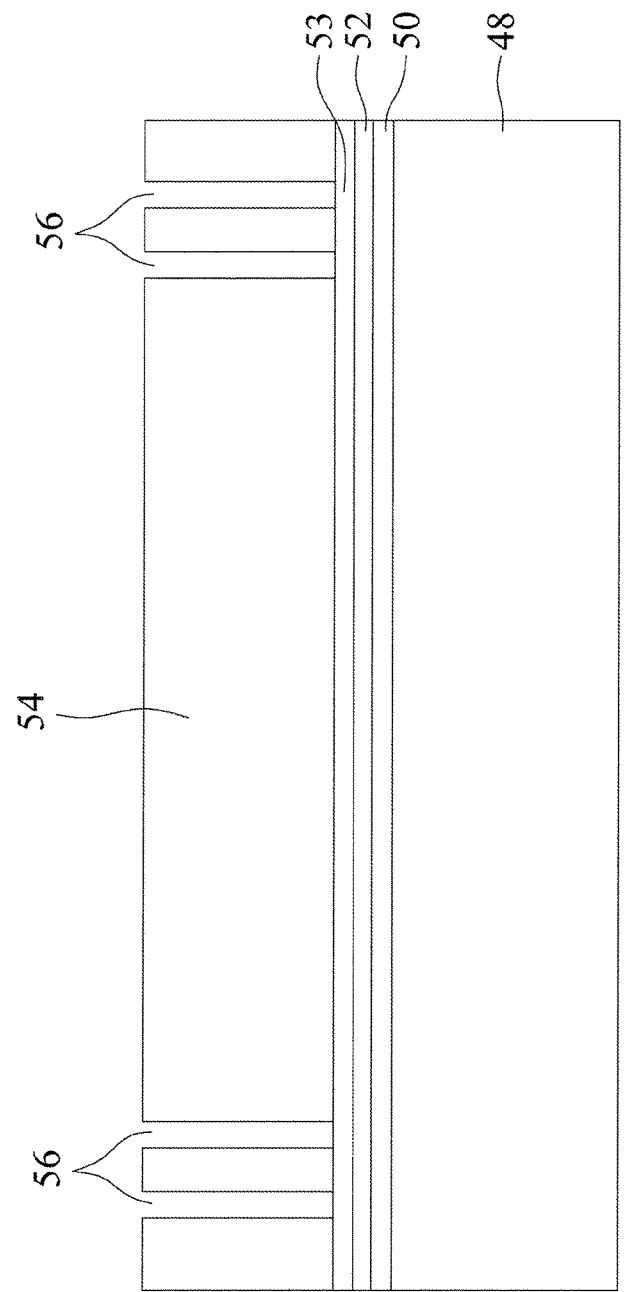
FIGS. 2 through 16 illustrate the cross-sectional views of intermediate stages in the formation of a package in accordance with some embodiments.

FIGS. 2 through 16 illustrate the cross-sectional views of intermediate stages in the packaging of die 100' in a package in accordance with some exemplary embodiments. Referring to FIG. 2, carrier 48 is provided, and adhesive layer 50 is disposed on carrier 48. Carrier 48 may be a blank glass carrier, a blank ceramic carrier, or the like. Adhesive layer 50 may be formed of an adhesive such as an Ultra-Violet (UV) glue, a Light-to-Heat Conversion (LTHC) glue, or the like, although other types of adhesives may be used. In some embodiments, adhesive layer 50 has the function of decomposing under the heat of light and hence releasing carrier 48 from the structure formed thereon.

In some embodiments, buffer layer 52 is formed over adhesive layer 50. Alternatively, no buffer layer 52 is formed over adhesive layer 50. In accordance with some embodiments of the present disclosure, buffer layer 52 is a dielectric layer, which may be a polymer layer. The polymer may be, for example, polyimide, PBO, BCB, Solder Resist film (SR), or the like. Buffer layer 52 is a planar layer with a uniform thickness, which may be greater than about 2 µm and may be between about 2 µm and about 40 µm. The top surface and the bottom surface of buffer layer 52 are also planar. In alternative embodiments, buffer layer 52 is not formed.

Seed layer 53 is formed over buffer layer 52, for example, through Physical Vapor Deposition (PVD) or metal foil lamination. Seed layer 53 may comprise copper, aluminum, titanium, or multi-layers thereof. In some embodiments, seed layer 53 comprises a titanium layer (not shown) and a copper layer (not shown) over the titanium layer. In alternative embodiments, seed layer 53 includes a single copper layer.

In accordance with some embodiments, photo resist 54 is applied over seed layer 53 and is then patterned. As a result, openings 56 are formed in photo resist 54, through which some portions of seed layer 53 are exposed.

Figure 3:
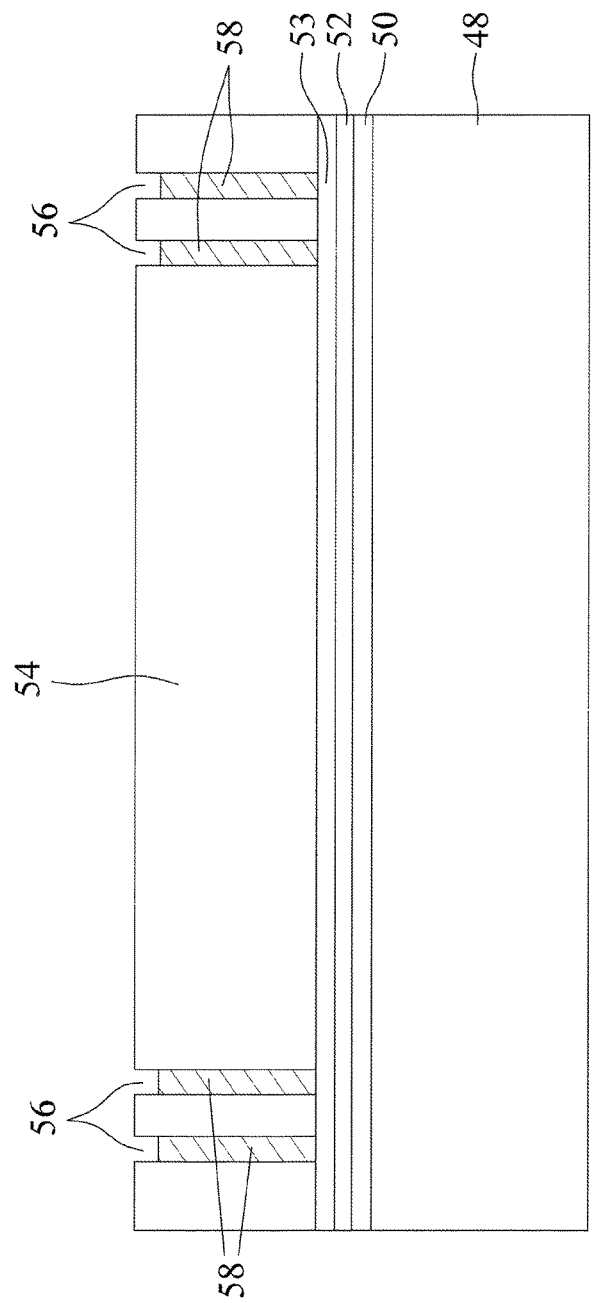

As shown in FIG. 3, through-vias 58 are formed in openings 56 through plating, which may be electro plating or electro-less plating. Through-vias 58 are plated on the exposed portions of seed layer 53. Through-vias 58 may include copper, aluminum, tungsten, nickel, or alloys thereof. The top-view shapes of through-vias 58 include, and are not limited to, rectangles, squares, circles, and the like. The heights of through-vias 58 are determined by the thickness of the subsequently placed die 100' (FIG. 5), with the heights of through-vias 58 greater than or equal to the thicknesses of die 100' in various embodiments.

Figure 4:
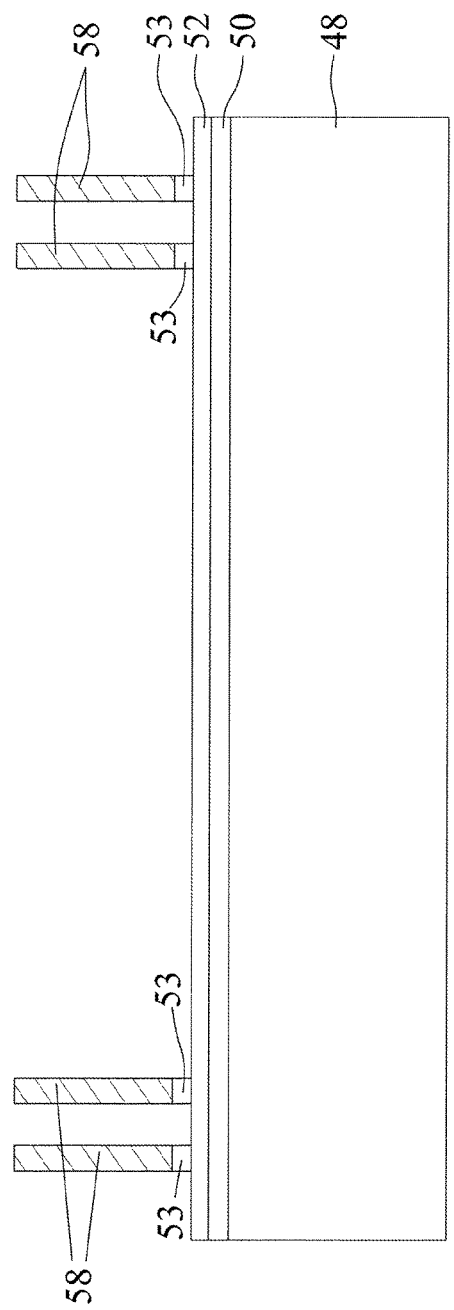

After the plating of through-vias 58, photo resist 54 is removed, and the resulting structure is shown in FIG. 4. In addition, the portions of seed layer 53 (FIG. 20) that are covered by photo resist 54 are exposed. An etch step is then performed to remove the exposed portions of seed layer 53, wherein the etching may be an anisotropic or isotropic etching. The portions of seed layer 53 that overlap by through-vias 58, on the other hand, remain not etched. Throughout the description, the remaining underlying portions of seed layer 53 are referred to as the bottom portions of through-vias 58. Although seed layer 53 is shown as having distinguishable interfaces with the overlying portions of through-vias 58, when seed layer 53 is formed of a material similar to or the same as that of the respective overlying through-vias 58, seed layer 53 may be merged with through-vias 58 with no distinguishable interface therebetween. Accordingly, seed layers 53 are not shown in subsequent drawings. In alternative embodiments, there exist distinguishable interfaces between seed layer 53 and the overlying plated portions of through-vias 58.

Figure 5:
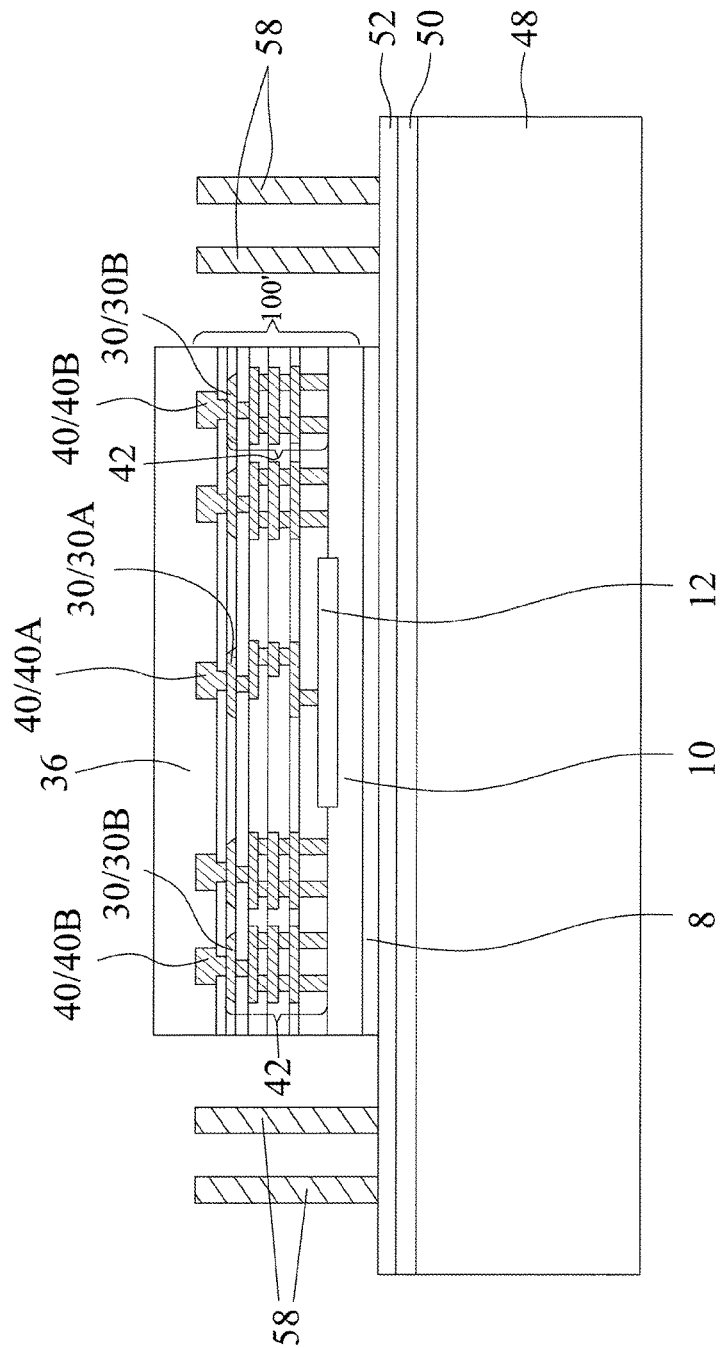

FIG. 5 illustrates the placement of device die 100' over buffer layer 52. Device die 100' may be adhered to buffer layer 52 through DAF 8. Although FIG. 5 illustrates the placement of a single device die 100', a plurality of device dies 100' may be placed over buffer layer 52, wherein the plurality of placed device dies 100' may be placed as a plurality of rows and columns.

Figure 6:
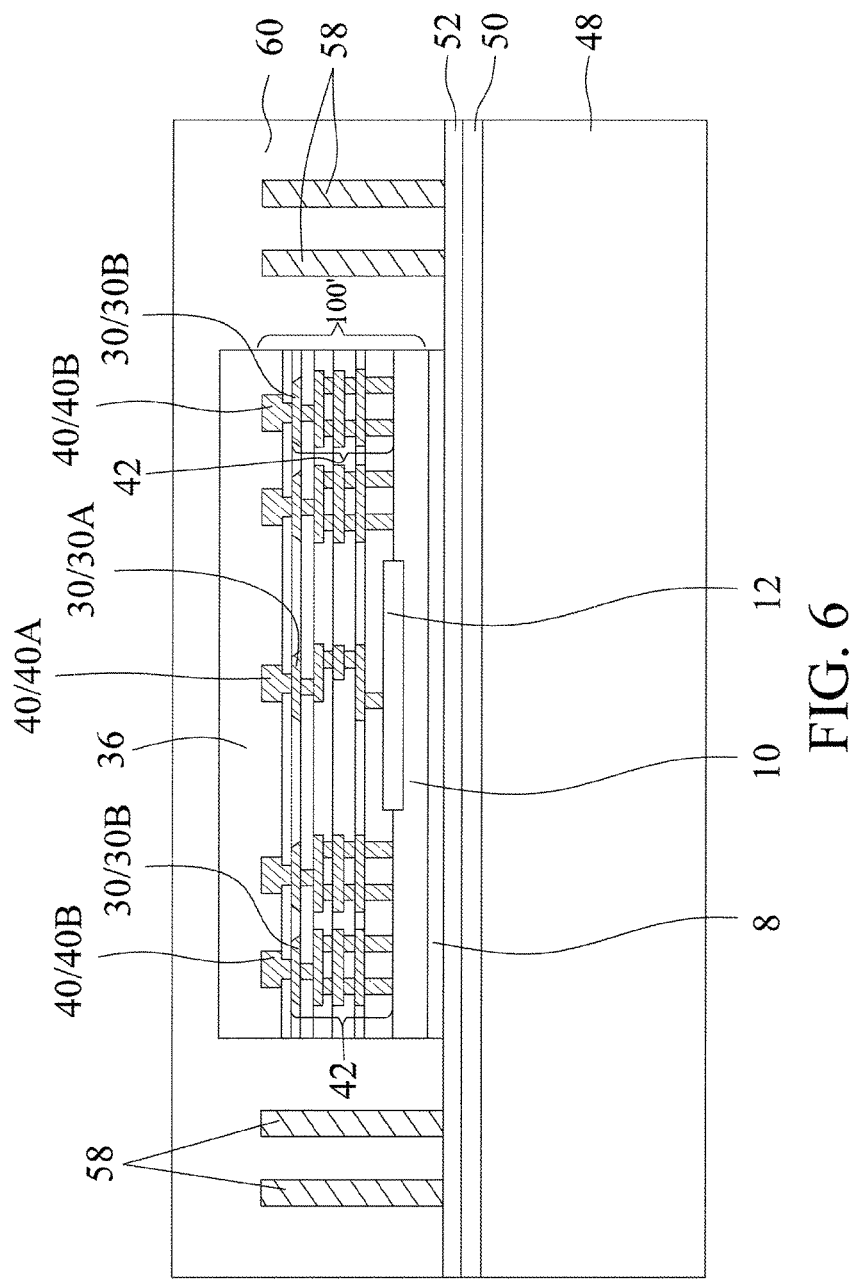

Referring to FIG. 6, molding material 60 is molded on device die 100' and through-vias 58. Molding material 60 fills the gaps between device die 100' and through-vias 58 and may be in contact with buffer layer 52. Molding material 60 may include a molding compound, a molding underfill, an epoxy, or a resin. After the molding process, the top surface of molding material 60 is higher than the top ends of metal pillars 40 and through-vias 58. Molding material 60 is dispensed as a fluid and is then cured.

Figure 7:
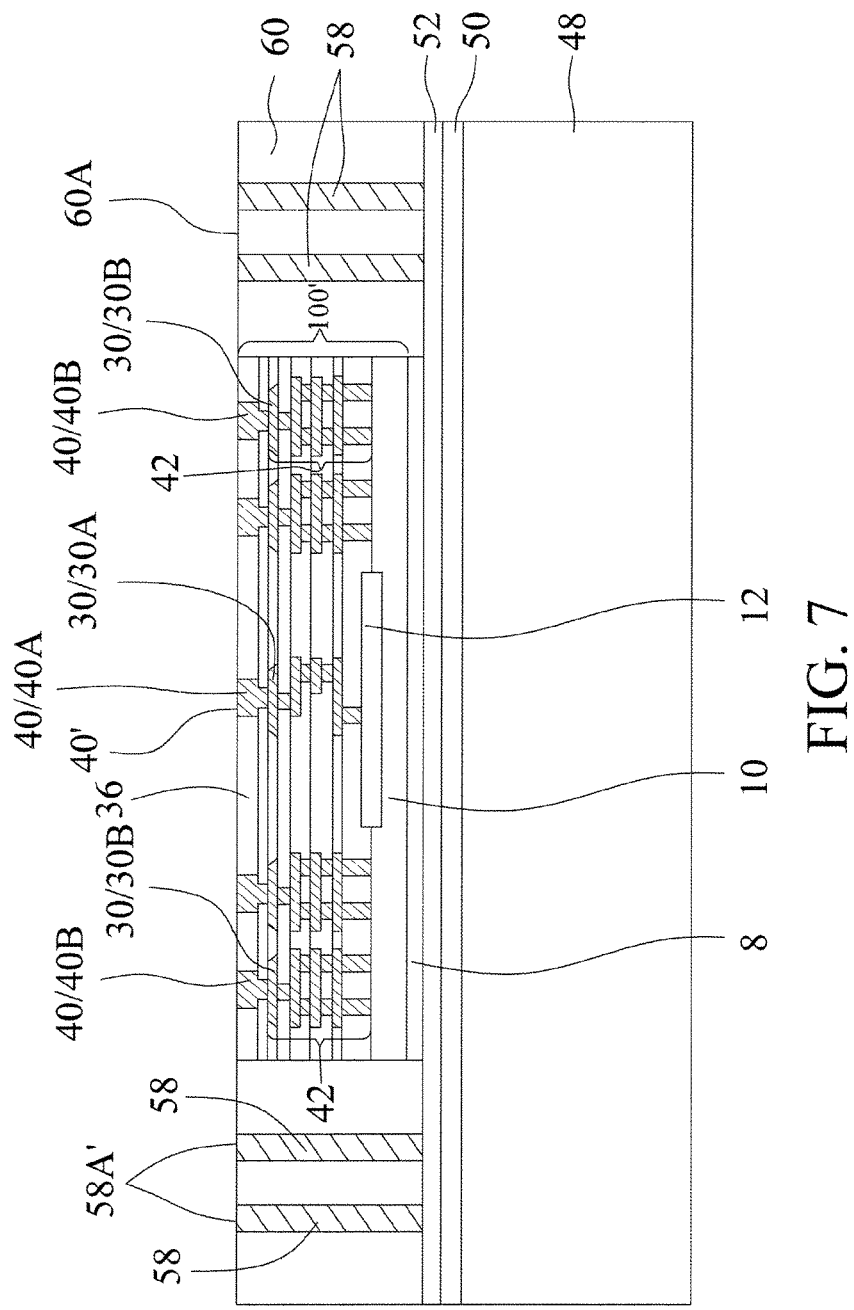

Next, a planarization step such as a Chemical Mechanical Polish (CMP) step or a grinding step is performed to thin molding material 60 until through-vias 58 are exposed. In some embodiments, as shown in FIG. 7, the portions of polymer layer 36 on the tops of metal pillars 40 are removed by the planarization. Metal pillars 40 are thus exposed as a result of the grinding. Due to the grinding, the top surfaces 58A' of through-vias 58 are substantially level (coplanar) with the top surfaces 40' of metal pillars 40 and are substantially level (coplanar) with top surface 60A of molding material 60.

Figure 8:
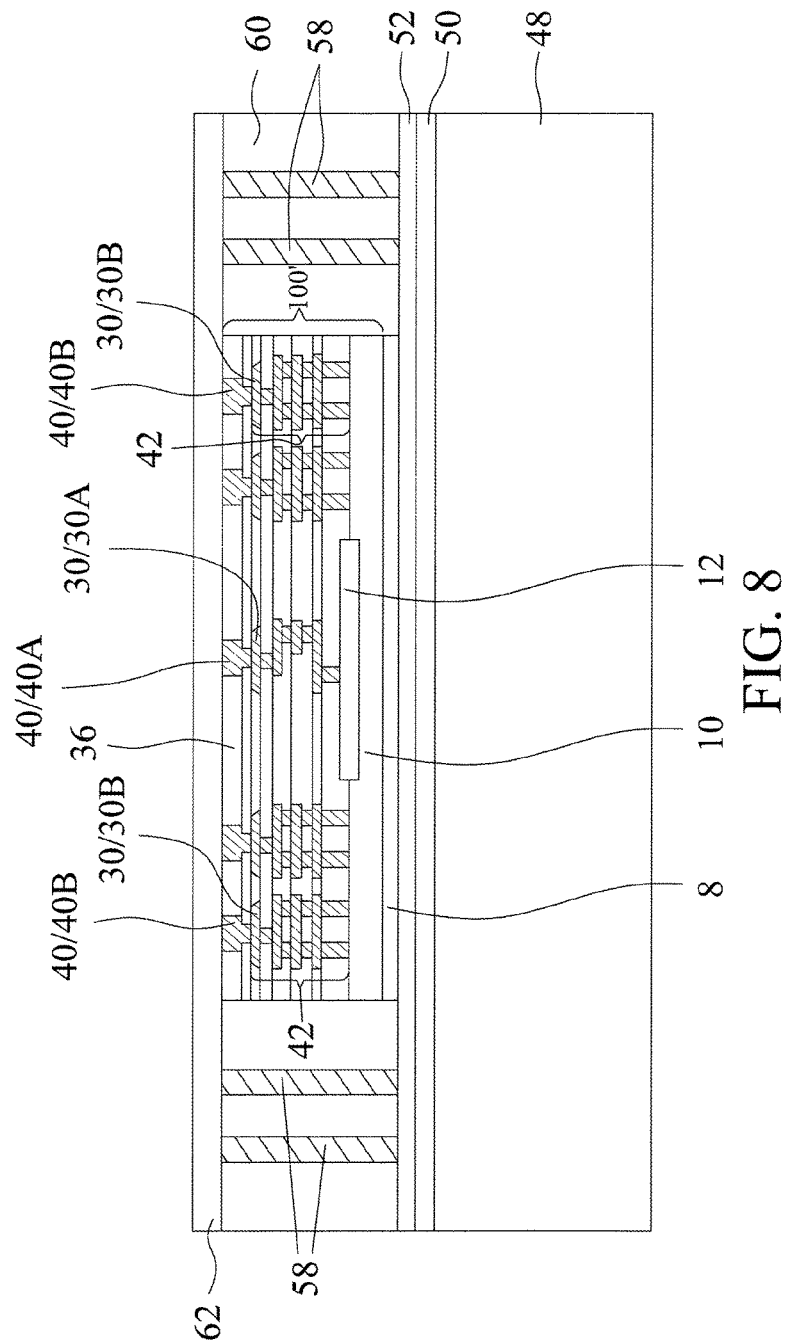

Referring to FIG. 8, dielectric layer 62 is formed over and contacts molding material 60, through-vias 58, and metal pillars 40. In accordance with some embodiments of the present disclosure, dielectric layer 62 is formed of a polymer such as PBO, polyimide, or the like. In alternative embodiments, dielectric layer 62 is formed of an inorganic dielectric material such as silicon nitride, silicon oxide, silicon oxynitride, or the like.

Figure 9:
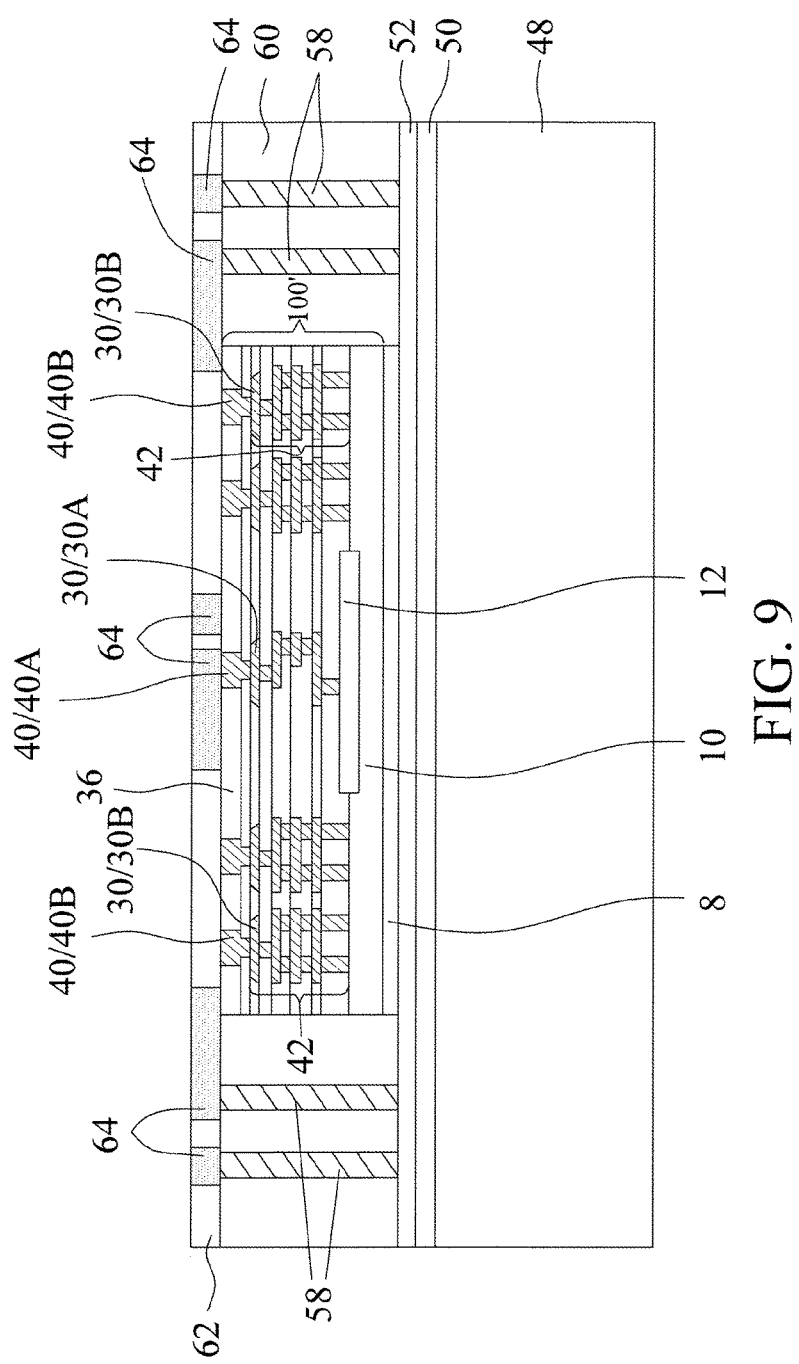

Next, referring to FIG. 9, Redistribution Lines (RDLs) 64 are formed to connect to metal pillars 40 and through-vias 58. RDLs 64 may also interconnect metal pillars 40 and through-vias 58. Although not illustrated, RDLs 64 may include metal traces (metal lines) and vias underlying and connected to RDLs 64. In these embodiments, the vias are formed in dielectric layer 62, and the metal traces are formed over dielectric layer 62. In some embodiments, RDLs 64 are formed in a plating process, wherein each of RDLs 64 includes a seed layer (not shown) and a plated metallic material over the seed layer. The seed layer and the plated metallic material may be formed of the same material or different materials.

As shown in FIG. 9, metal pillars 40A and through-vias 58 are electrically connected to, and may physically contact, RDLs 64. On the other hand, metal rings 40B may not be connected to any of RLDs 64. Accordingly, the entireties of the top surfaces of metal rings 40B are in contact with the bottom surface of dielectric layer 62 and are not in contact with any of metal features in accordance with the embodiments of the present disclosure.

Figure 10:
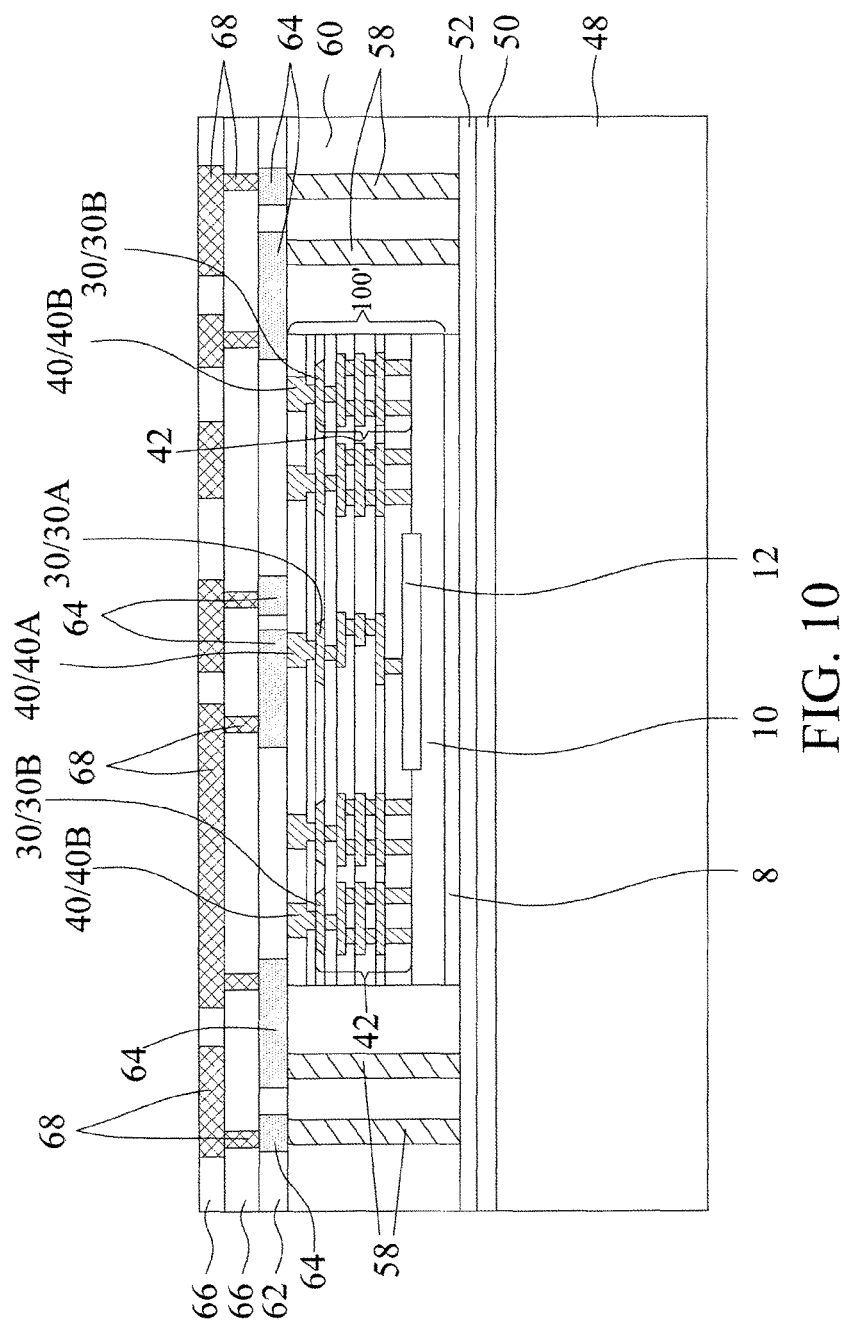

Referring to FIG. 10, in accordance with various embodiments, one or a plurality of dielectric layers 66 are formed over the structure shown in FIG. 9, with RDLs 68 formed in dielectric layers 66. In some embodiments, the formation of each layer of RDLs 68 includes forming a blanket seed layer, forming and patterning a mask layer over the blanket seed layer, performing a plating to form RDLs 68, removing the mask layer, and performing an etching step to remove the portions of the blanket seed layer not covered by RDLs 68. RDLs 68 may comprise a metal or a metal alloy including aluminum, copper, tungsten, and/or alloys thereof.

FIG. 10 illustrates one RDL layer 68. In alternative embodiments, there may be more than one layer of RDLs 68, depending on the routing requirement of the respective package. Dielectric layers 66 in these embodiments may comprise polymers such as PBO, polyimide, BCB, or the like. Alternatively, dielectric layers 66 may include non-organic dielectric materials such as silicon oxide, silicon nitride, silicon carbide, silicon oxynitride, or the like.

Figure 11:
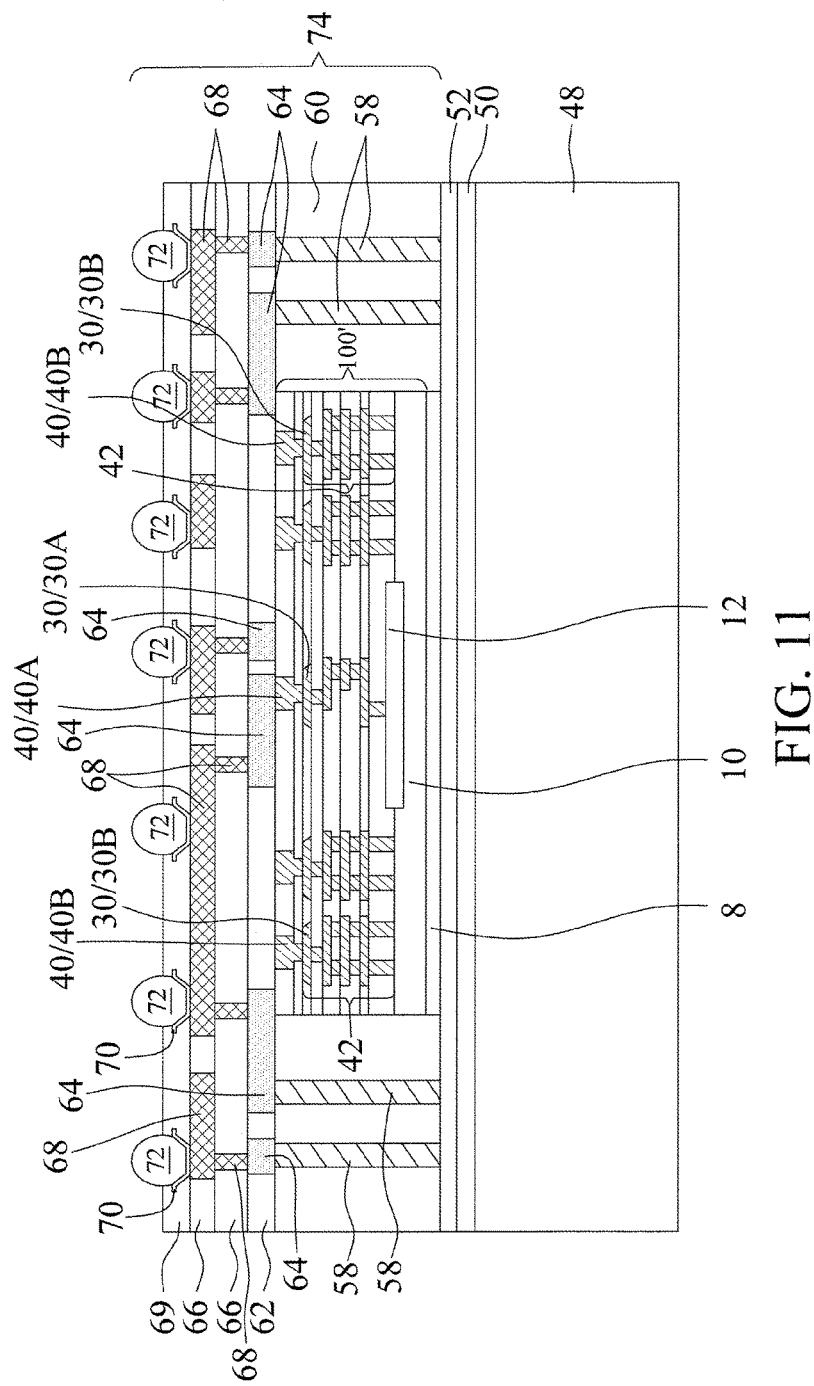

FIG. 11 illustrates the formation of dielectric layer 69, UBMs 70, and electrical connectors 72 in accordance with some exemplary embodiments. Dielectric layer 69 may be formed of a material selected from the candidate materials used for forming dielectric layers 62 and 66. The formation of electrical connectors 72 may include placing solder balls on the exposed portions of UBMs 70 and then reflowing the solder balls. In alternative embodiments, the formation of electrical connectors 72 includes performing a plating step to form solder regions over RDLs 68 and then reflowing the solder regions. Electrical connectors 72 may also include metal pillars, or metal pillars and solder caps, which may also be formed through plating. Throughout the description, the combined structure, including device die 100', through-vias 58, molding material 60, the overlying RDLs 64 and 68, and dielectric layers 62 and 66, will be referred to as package 74, which may be a composite wafer including a plurality of device dies 100'.

Figure 12:
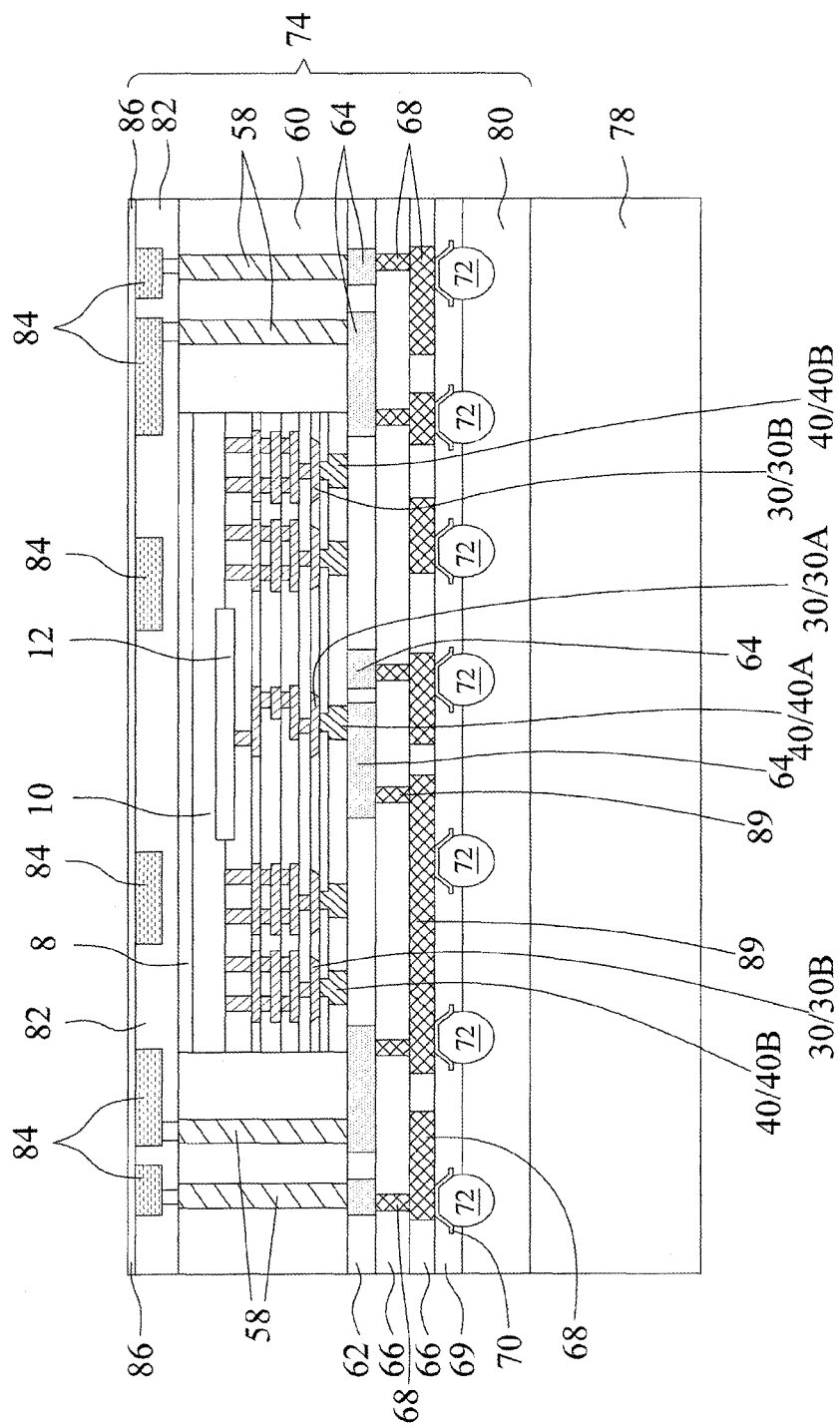

Next, package 74 is de-bonded from carrier 48, for example, by projecting a UV light or a laser on adhesive layer 50. The residue adhesive layer 50 and buffer layer 52 (if any) are also removed from package 74. The resulting structure is shown in FIG. 12. Package 74 is further adhered to carrier 78 through adhesive layer 80, wherein electrical connectors 72 may face toward contact adhesive 80. Dielectric layers 82 and RDLs 84 are then formed. In accordance with some embodiments of the present disclosure, the illustrated RDLs 84 represent a single RDL layer. In alternative embodiments, the illustrated RDLs 84 represent more than one RDL layer, wherein vias are formed to interconnect the different metal traces in different RDL layers. Dielectric layers 82 may also be formed of a polymer such as PBO, BCB, polyimide, or an inorganic material such as silicon oxide, silicon nitride, silicon oxynitride, or the like.

Figure 13:
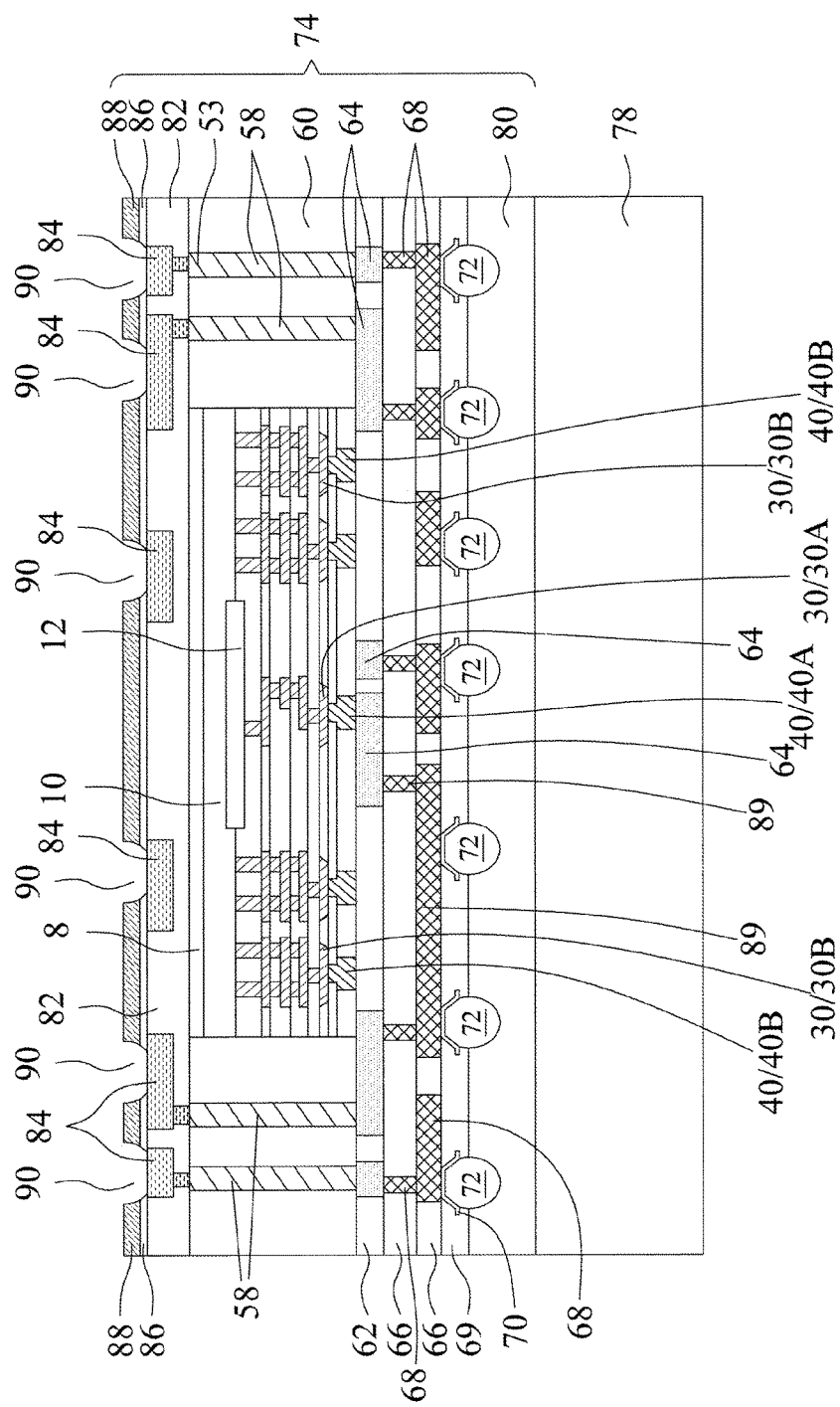

As also shown in FIG. 12, dielectric layer 86 is formed over RDLs 84 and dielectric layers 82. Dielectric layer 86 may be formed of PBO or other organic or inorganic materials. In some embodiments, as shown in FIG. 13, tape 88 is formed/laminated over dielectric layer 86. Openings 90 are then formed in dielectric layer 86 and tape 88, and hence the metal pads in the top RDLs 84 are exposed.

Figure 14:
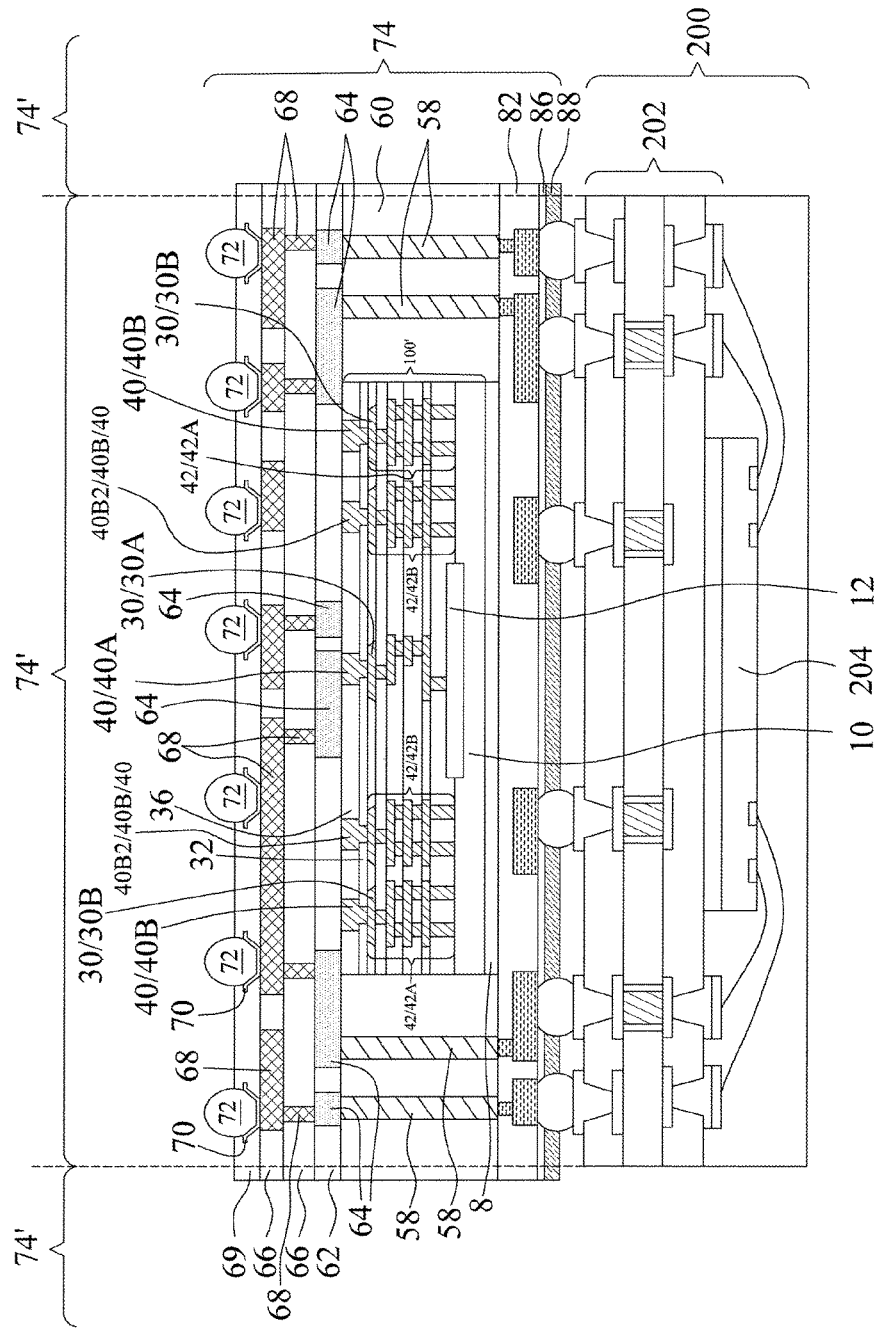

In subsequent steps, package 74 is bonded to package component 200, and the resulting structure is shown in FIG. 14. In accordance with some embodiments, package component 200 is a package including memory die(s) (such as Static Random Access Memory (SRAM) dies or Dynamic Random Access Memory (DRAM) dies) 204 therein. Furthermore, package component 200 may include package substrate 202, on which die 204 is bonded.

FIG. 14 illustrates that one die 100' is molded in molding material 60. In the manufacturing processes, a plurality of die 100' may be molded at the same time by molding material 60. Throughout the description, package 74 includes a plurality of packages 74', each including one of device dies 100' and the surrounding through-vias 58. Accordingly, each of packages 74' may be bonded to one of a plurality of package components identical to package component 200. After the bonding, a sawing step is performed to saw package 74 into a plurality of packages, each including one of packages 74' and the corresponding package component 200.

In the embodiments in FIG. 14, the bottom surfaces of metal rings 40B are in contact with the top surface of metal pad 30B, which also forms a ring. In these embodiments, metal ring 40B and the corresponding seal ring 42 may be electrically floating or electrically grounded.

Figure 15:
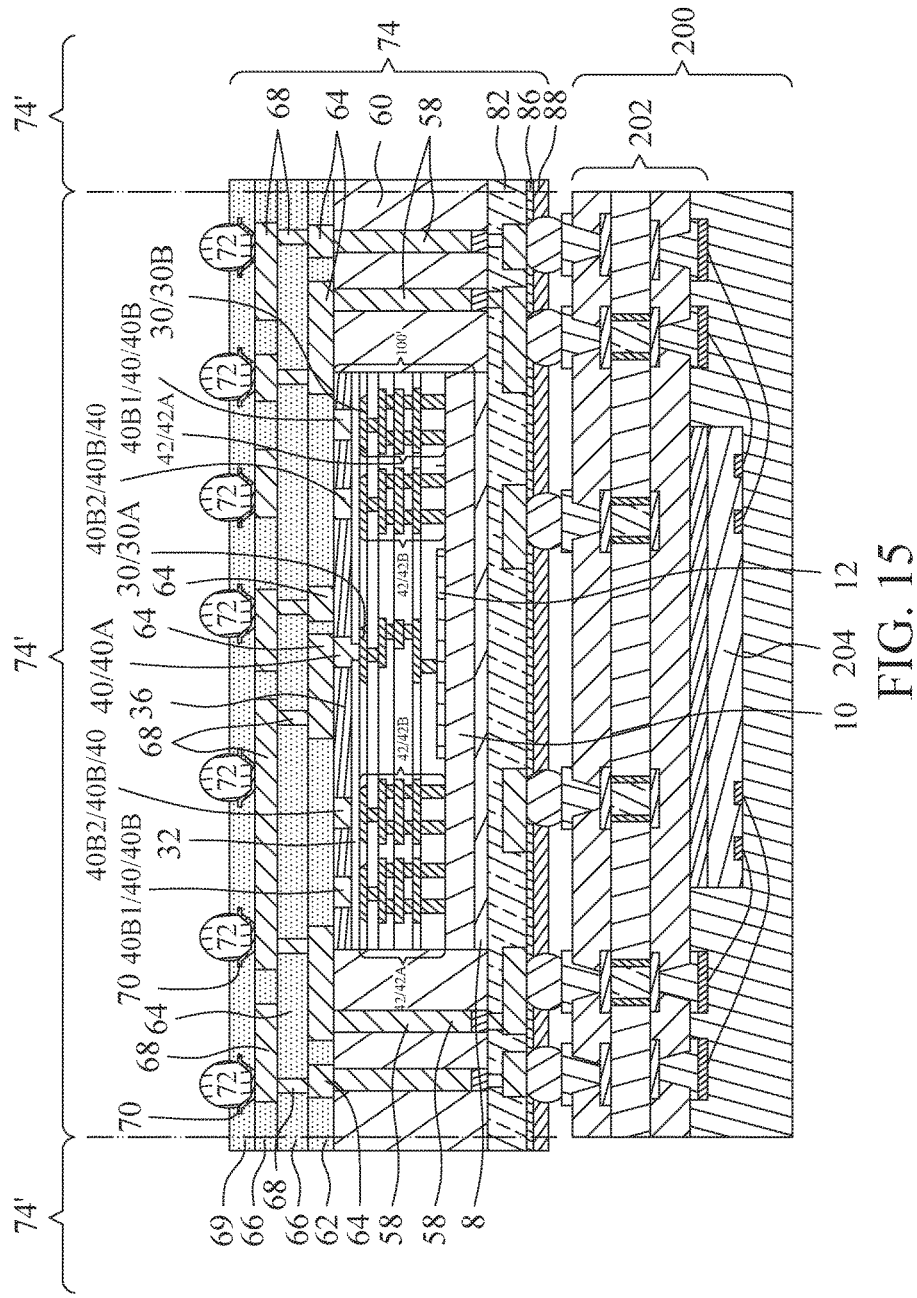

In accordance with alternative embodiments, as shown in FIG. 15, the bottom surfaces of metal ring 40B are in contact with the top surface passivation layer 32 and are spaced apart from the top surface of metal pad 30B by passivation layer 32. Accordingly, metal ring 40B is fully insulated in dielectric matric materials, with dielectric layer 62, 32, and 36 fully enclosing metal ring 40B therein. Furthermore, in these embodiments, metal ring 40B is electrically floating.

Figure 16:
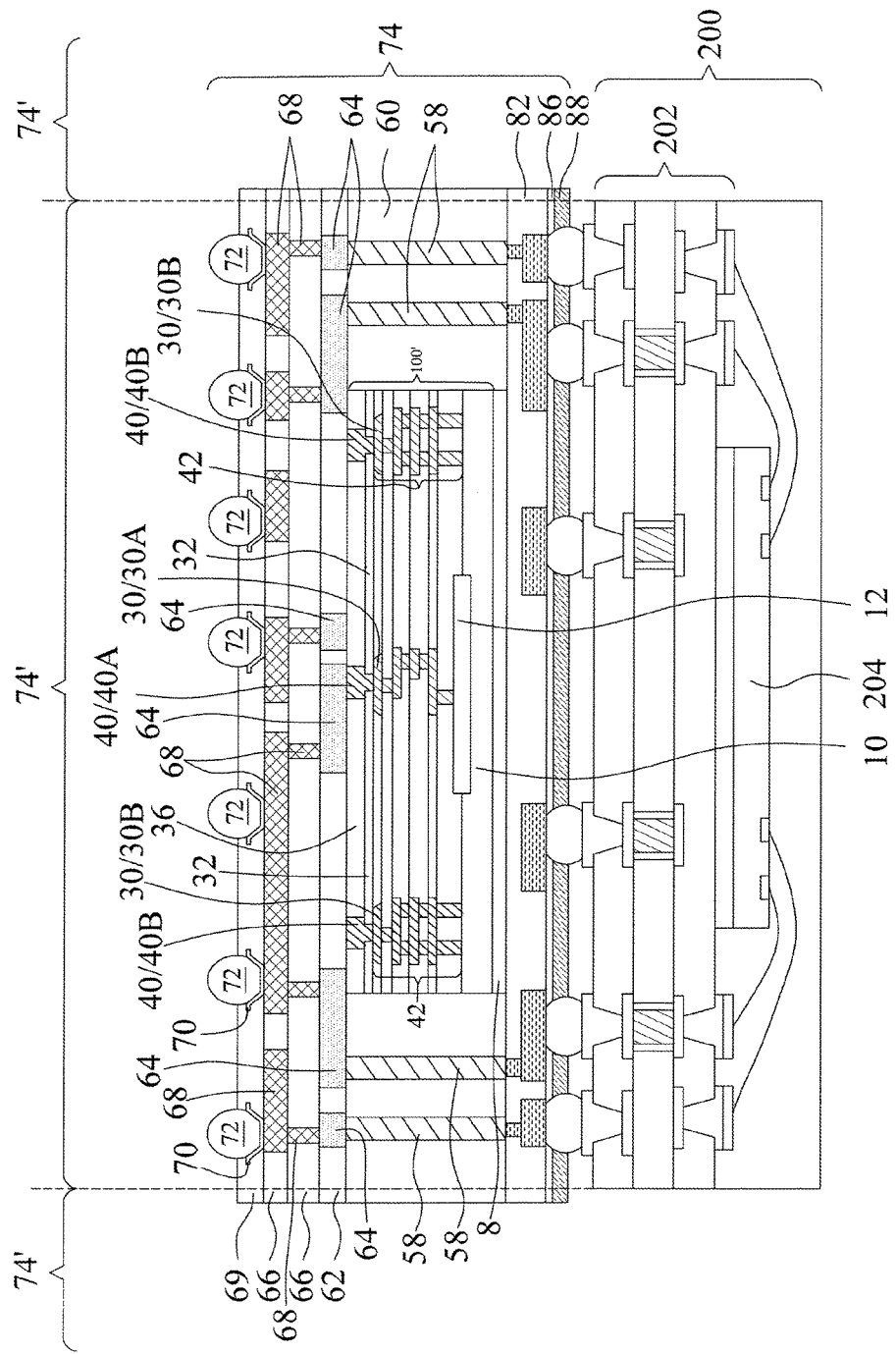

FIGS. 14 and 15 illustrate that there are two seal rings (marked as 42A and 42B and two metal rings 40B1 and 40B2, with seal ring 42A encircling seal ring 42B. Metal ring 40B1 further encircles metal ring 40B2. In accordance with alternative embodiments, as shown in FIG. 16, there is a single seal ring 42 and a single metal ring 40B.

FIG. 17 illustrates the top view of wafer 100 and device dies 100' therein. In accordance with some embodiments, the width A of metal ring 40B is between about 15 μm and about 70 μm. Width A of metal ring 40B may be greater than, equal to, or smaller than the width E of metal pad 30. The width or diameter C of copper pillars 40A may be between about 50 μm and about 100 μm. It is appreciated, however, that the values recited throughout the description are merely examples and may be changed to different values. The spacing D between metal rings 40B1 and 40B2 may be greater than about 20 μm. FIG. 17 illustrates that seal rings 42 are wider than the respective overlying metal rings 40B in some embodiments, with the enclosure being represented by B, which may be greater than 2 μm. In alternative embodiments, seal rings 42 may be narrower than the respective overlying metal rings 40B.

The embodiments of the present disclosure have some advantageous features. If the metal ring is not formed in the top polymer layer in the step of sawing the wafer into the plurality of device dies, as shown in FIG. 1, the mechanical force applied by the sawing blade may cause delamination between the top polymer layer and the underlying dielectric layer, such as the passivation layer. By forming the metal ring, the mechanical strength of the wafer is improved, and the likelihood of delamination occurring is reduced. Furthermore, the formation of the metal ring further improves the resistance of the dies to the penetration of moisture.

In accordance with some embodiments of the present disclosure, a die includes a metal pad, a passivation layer over the metal pad, and a polymer layer over the passivation layer. A metal pillar is over and electrically coupled to the metal pad. A metal ring is coplanar with the metal pillar, with the metal ring having a plurality of sides proximate edges of the die. The polymer layer includes a portion coplanar with the metal pillar and the metal ring.

In accordance with alternative embodiments of the present disclosure, a structure includes a die. The die includes a first metal pad, and a second metal pad coplanar with the first metal pad, wherein the second metal pad forms a ring encircling the first metal pad. The die further includes a passivation layer over the first metal pad and the second metal pad, with the passivation layer having an opening aligned to a center portion of the first metal pad. A polymer layer is over the passivation layer. A metal pillar is over and electrically coupled to the first metal pad. A metal ring is coplanar with the metal pillar, with the metal ring encircling the metal pillar. The metal ring overlaps the second metal pad. A seal ring is underlying and overlapped by the metal ring. A molding material surrounds the die, wherein a top surface of the molding material is coplanar with a first top surface of the metal pillar and a second top surface of the metal ring. A dielectric layer is over and in contact with the molding material. Redistribution lines are formed in the dielectric layer and electrically coupled to the metal pillar, wherein an entirety of the metal ring is covered by the dielectric layer.

In accordance with yet alternative embodiments of the present disclosure, a method includes forming a die, which includes a metal pillar, a metal ring coplanar with the metal pillar, with the metal ring having four sides proximate edges of the die, and a polymer layer including a portion coplanar with the metal pillar and the metal ring. The metal pillar and the metal ring are encircled by the polymer layer. The method further includes molding the die in a molding material, and grinding the molding material to expose a first top surface of the metal pillar and a second top surface of the metal ring.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a die comprising:
      a first metal pad;
      a passivation layer over the first metal pad;
      a polymer layer over the passivation layer;
      a metal pillar over and electrically coupled to the first metal pad; and
      a metal ring coplanar with the metal pillar, wherein the polymer layer comprises a first portion coplanar with the metal pillar and the metal ring, wherein in a top view of the die, the metal ring encircles a portion of the polymer layer.

2. The structure of claim 1 further comprising a second metal pad coplanar with the first metal pad, wherein the second metal pad forms an additional metal ring adjacent to edges of the die.

3. The structure of claim 2, wherein the metal ring comprises a bottom surface in contact with a top surface of the passivation layer, with the metal ring fully separated from the second metal pad.

4. The structure of claim 1, wherein the metal ring is electrically floating.

5. The structure of claim 1 further comprising a seal ring overlapped by the metal ring, wherein the seal ring extends into a plurality of Inter-Metal Dielectric (IMD) layers.

6. The structure of claim 1 further comprising:
a molding material molding the die therein;
a plurality of through-vias penetrating through the molding material;
a dielectric layer with a surface contacting the molding material; and
redistribution lines in the dielectric layer and electrically coupled to the metal pillar and the plurality of through-vias, wherein the metal ring comprises a surface coplanar with the surface of the dielectric layer, and wherein an entirety of the surface of the metal ring is in contact with the dielectric layer.

7. The structure of claim 1, wherein the polymer layer further comprises a second portion and a third portion overlapping the metal pillar and the metal ring, respectively.

8. The structure of claim 1, wherein the metal ring comprises an inner sidewall contacting an outer sidewall of the portion of the polymer layer, and wherein the portion of the polymer layer fully encircles the metal pillar, with an inner sidewall of the region of the polymer layer contacting a sidewall of the metal pillar.

9. The structure of claim 1 further comprising an additional metal ring encircling the metal ring.

10. The structure of claim 9, wherein an additional portion of the polymer layer is between the metal ring and the additional metal ring, and opposite sidewalls of the additional portion of the polymer layer are in contact with both the metal ring and the additional metal ring.

11. A structure comprising:
a die comprising:
a first metal pad;
a second metal pad coplanar with the first metal pad, wherein the second metal pad forms a ring encircling the first metal pad;
a passivation layer over the first metal pad and the second metal pad, with the passivation layer comprising an opening aligned to a center portion of the first metal pad;
a polymer layer over the passivation layer;
a metal pillar over and electrically coupled to the first metal pad;
a metal ring coplanar with the metal pillar, with the metal ring encircling the metal pillar, wherein the metal ring overlaps the second metal pad; and
a seal ring underlying and overlapped by the metal ring;
a molding material surrounding the die, wherein a top surface of the molding material is coplanar with a first top surface of the metal pillar and a second top surface of the metal ring;
a dielectric layer over and in contact with the molding material; and
redistribution lines in the dielectric layer and electrically coupled to the metal pillar, wherein an entirety of the metal ring is covered by the dielectric layer.

12. The structure of claim 11, wherein no conductive feature in the dielectric layer is in contact with the metal ring.

13. The structure of claim 11, wherein the metal ring is in contact with the second metal pad.

14. The structure of claim 11, wherein the metal ring comprises a portion in the passivation layer, with a bottom surface of the portion of the metal ring in contact with the second metal pad.

15. The structure of claim 13, wherein the metal ring comprises a bottom surface in contact with a top surface of the passivation layer, with the metal ring fully separated from the second metal pad by the passivation layer.

16. The structure of claim 13, wherein the metal ring is fully insulated in dielectric materials, with all surfaces of the metal ring in contact with the dielectric materials.

17. A structure comprising:
a device die comprising a metal ring proximal peripherals of the device die, wherein the metal ring is either electrically floating or electrically grounded;
through-vias at a same level as the device die;
an encapsulating material encapsulating the device die therein; and
a polymer layer in contact with the encapsulating material, the through-via, and the metal ring.

18. The structure of claim 17, wherein the polymer layer is over the metal ring, and an entirety top surface of the metal ring is in physical contact with the polymer layer to form an interface.

19. The structure of claim 17, wherein the device die further comprises:
a semiconductor substrate; and
a seal ring extending from a bottom surface of the metal ring to a top surface of the semiconductor substrate.

20. The structure of claim 17, wherein the metal ring is fully insulated by dielectric materials.

* * * * *